United States Patent [19]
Ryon

[11] 4,077,010
[45] Feb. 28, 1978

[54] DIGITAL PULSE DOUBLER WITH 50 PERCENT DUTY CYCLE

[75] Inventor: Donald Carroll Ryon, Carol Stream, Ill.

[73] Assignee: Motorola, Inc., Schaumburg, Ill.

[21] Appl. No.: 748,615

[22] Filed: Dec. 8, 1976

[51] Int. Cl.² .......................................... H03B 19/00
[52] U.S. Cl. ...................................... 328/20; 328/38
[58] Field of Search ........................... 328/16, 20, 38

[56] References Cited
U.S. PATENT DOCUMENTS

| | | | |
|---|---|---|---|
| 3,764,927 | 10/1973 | Allinger | 328/20 X |
| 3,786,357 | 1/1974 | Isle | 328/38 |

*Primary Examiner*—John S. Heyman
*Attorney, Agent, or Firm*—Margaret Marsh Parker; James W. Gillman

[57] ABSTRACT

A symmetrical duty cycle waveform at twice the input frequency is provided for use as in a programmable tone generator by a quad two-input integrated circuit device using two RC delay circuits. By varying the delay circuits, two separate clock pulses with different duty cycles can be provided at the original clock frequency.

5 Claims, 4 Drawing Figures

DIGITAL PULSE DOUBLER WITH 50 PERCENT DUTY CYCLE

BACKGROUND OF THE INVENTION

This invention relates to the field of digital frequency doublers and more particularly to doublers providing an output having a symmetrical duty cycle for use in a programmable tone generator.

When it is desired to divide a relatively high frequency, e.g. four megahertz, down to a relatively low or audio frequency, it is well known to use the signal as the clock input to a chain or programmable synchronous counters with the appropriate output point coupled back to the "carry-in" input to provide the desired divisor number. However, the output is usually not symmetrical, and it is known to first multiply the original signal by a factor of two, then divide by two after the programmable divider to obtain the symmetrical output.

When the output of the programmable synchronous divider is a series of narrow pulses, and a square wave is needed in order to provide a strong fundamental tone as in the audio range, the narrow pulses of the divider output can be coupled to a bi-stable multivibrator in order to create a square wave. This, however, divides the output frequency by two, and requires doubling the input clock frequency. In certain applications, e.g., the programmable tone generator disclosed in U.S. Pat. No. 3,939,751, and assigned to the assignee of the present invention, an output rich in fundamentals is required for obtaining the musical tones for a musical instrument, and a ripple divider chain was used. When it became desirable to use a synchronous divider, as disclosed in Ser. No. 736,985, filed on Oct. 29, 1976 and assigned to the same assignee, the output of the synchronous divider was required to be processed to obtain the necessary square wave output thus the frequency was divided by two. Since it was economically desirable to continue using the original crystal, a doubler circuit was necessary in order to compensate for the divide-by-two function of the bi-stable multivibrator at the output of the divisor. Since the binary counters of the synchronous programmable divider require a minimum pulse width for proper operation at clock rates above three megahertz, a doubler circuit was needed which provided substantially 50 percent duty cycle output.

SUMMARY OF THE INVENTION

It is therefore an object of the present invention to allow the use of a given frequency oscillator in a programmable tone generator when changing from a ripple to a synchronous programmable divider.

It is a specific object to provide this capability while still providing a square wave output from the divider. It is an additional object to provide two outputs of a clock circuit having different phases and different duty cycles.

In accordance with the present invention, the above objectives are achieved for the programmable tone generator by doubling the referenced crystal frequency in a doubler circuit including four NOR gate circuits and two delay circuits, each of the latter having a delay time of one half the original pulse width. The propagation delays of the gates are not a factor in this design. Two separate clock pulses, at the original frequency, can be provided by adjusting the delay circuits and taking the two outputs from the second and third inverters.

DETAILED DESCRIPTION OF A PREFERRED EMBODIMENT

Figure 1:
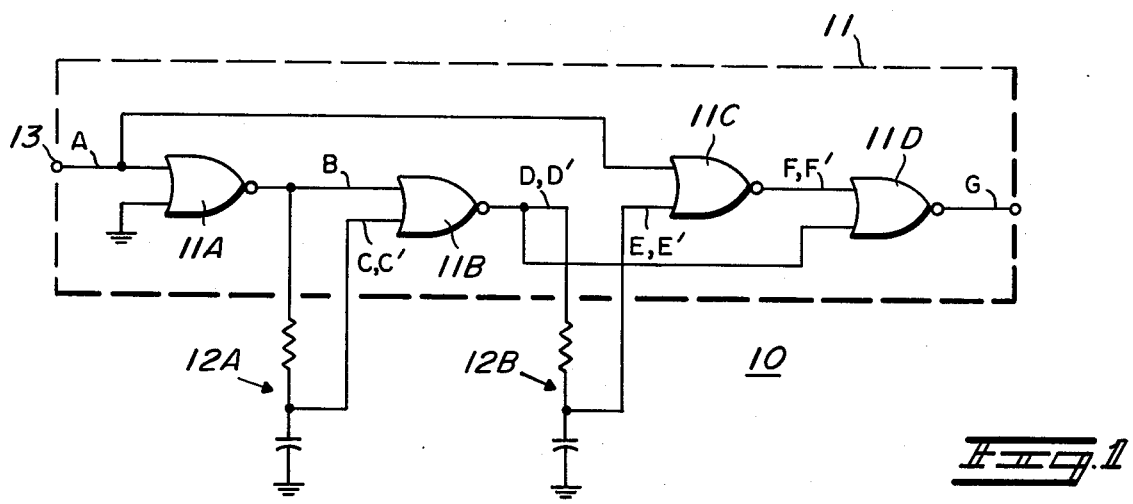
FIG. 1 is a schematic/logic diagram of a doubler in accordance with the invention.

Referring now more particularly to the drawing, in FIG. 1 a digital doubler circuit, referenced generally as numeral 10, includes an integrated circuit 11 and two delay circuits 12A and 12B. The integrated circuit 11 includes four NOR gates 11A-D with the requisite interconnections as shown, and could be realized by a Motorola MC7402 or by other comparable logic circuits. The operation of the double 10 will be explained in detail in connection with FIGS. 3 and 4.

Figure 2:
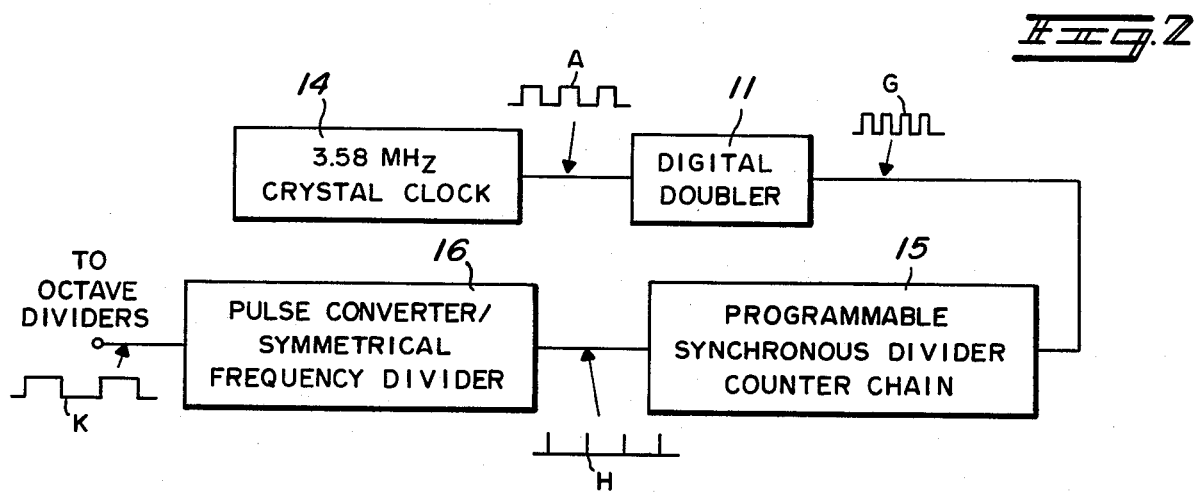
FIG. 2 is a block diagram of a system using the doubler of the invention.

FIG. 2 shows the doubler 10 in the environment of a programmable tone generator as for an electronic musical instrument. A low cost crystal 14, such as a 3.58 MHz crystal which is widely used in television circuitry, provides the primary signal source at an input terminal 13. The output frequency A of the crystal 14 is multiplied by two in the doubler 10 and the doubler output G is coupled to a plurality of programmable synchronous divider counter chains 15 (one shown) where the frequencies for a chosen musical scale are produced. The musical instruments of the above-referenced patents have the capability of providing an almost limitless variety of musical scales, varying as to pitch in the usual sense and as to the intervals between adjacent notes of the scale.

Since the remainder of the instrument's circuitry requires a square wave for its strong fundamental component, the narrow spikes H of the divider chain outputs are changed to square waves K having half the frequency of the spikes H. This transformation is done in a pulse converter/symmetrical frequency divider 16, which may be a bi-stable multivibrator. These square waves K provide the frequencies for the top octave of the instrument and are further divided by multiples of two in octave dividers to provide the corresponding tones for the instrument's lower octaves. Note that the waveforms H and K are audio frequencies and are not drawn to the same scale as the waveforms A and G.

Figure 3:
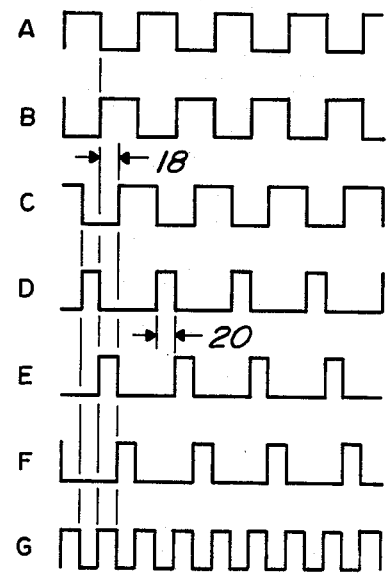
FIG. 3 is a time chart of the doubler of FIG. 2

FIG. 3 provides a time chart of the signals at various pertinent points in the doubler 10. The input A is representative of the crystal clock frequency and is a symmetrical square wave. This input A is coupled to a first input of a first NOR gate 11A and to a first input of a second NOR gate 11C. The second input of the NOR gate 11A is coupled to ground or to a source of reference potential and the output signal is an inversion of the input A or, in other words, the leading edges of the pulses of signal B lag those of the input signal A by 180°. The signal B is coupled to the first input of a third NOR gate 11B and to a delay circuit 12A which, at the crystal frequency, delays the signal B by one half pulse width as indicated at point 18. The input signal C of the NOR gate 11B then is identical to signal B but with the leading edge lagging that of signal B by 90° and the output of the NOR gate 11B is the signal D having the same frequency as the crystal frequency, but having a pulse width half that of the input signal A. As is well known, a NOR gate outputs a high only when both inputs are low. Therefore, since the square wave signals B and C are displaced relative to each other by 90°, the signal D is composed of pulses half the width of the pulses of signals B or C with D lagging A by 90°. The signal D is coupled to a second delay circuit 12B wherein it is delayed by half the pulse width of the signal A, producing the signal E, the leading edges of which lag those of signal D by 90° as indicated at point 20. It is to be noted here that the signal E has been passed through two gates as well as the second delay circuit. Depending on the logic elements used and the frequency of the clock, the propagation times of the gates could be a significant fraction of the clock pulse width. In this event, the components of the second delay circuit would be chosen to cause the signal E to arrive at the input of the NOR gate 11C lagging signal A by 180°. Signal E is coupled to a second input of the NOR gate 11C which has signal A on the first input, thus the output signal F or NOR gate 11C will have the same frequency as the the signal A but have a pulse width half that of signal A and have leading edges lagging signal A by 270°. The signal F is coupled to one input of NOR gate 11D, and signal D to the second input, providing an output signal G which combines the pulses of the signals F and D. The signal G thus has pulses half the width of those of signal A at twice the frequency.

Figure 4:
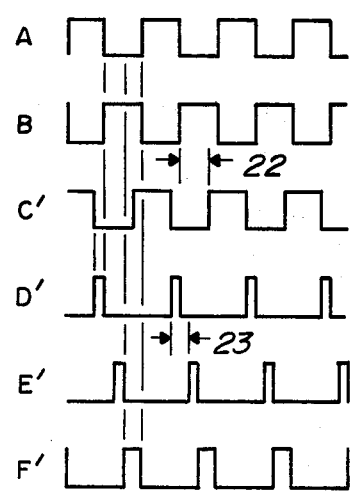
FIG. 4 is a time chart of the circuit of FIG. 1 used to provide dual clock pulses.

FIG. 4 shows the time chart of an embodiment for providing two clock signals of different pulse widths and phase relationships, but the same frequency as the input clock signal A. This is accomplished by having the first delay period substantially different from the second delay period and taking the output points ahead of the NOR gate 11D. Signals A and B are as in FIG. 3, but the componenent values of the delay line 12A have been chosen to provide a greater delay for signal B than that provided in FIG. 3, as shown at point 22. Thus the signal D', the output of the NOR gate 11B has a narrower pulse than that of signal D of FIG. 2. In the example of FIG. 4, the delay time of the delay circuit 12B is one half pulse width as at point 23. With signals A and E' coupled to the inputs of NOR gate 11C the output thereof is the signal F', having one half the pulse width of the input signal A and the same frequency. Thus, from the original square wave clock input A, there have been provided two clock signals D' (or E') and F' of the same frequency but differing pulse widths. Other pulse widths and phase relationships are possible with appropriate choice of components in the delay circuits 12.

The invention could, of course, be carried out by using other logic elements than those shown. It is intended to cover all embodiments and variations thereof as fall within the spirit and scope of the appended claims.

What is claimed is:

1. A frequency doubler having symmetrical duty cycle output comprising:
    an input means having the first frequency signal applied thereto;
    a first gate having a first input coupled to the input means and a second input coupled to a point of reference potential;
    a first delay means coupled to the output of the first gate for providing a first delay period;
    a second gate having a first input coupled to the output of the first gate and having a second input coupled to the output of the first delay means;
    a second delay means coupled to the output of the second gate for providing a second delay period;
    a third gate having one input coupled to the input means and having a second input coupled to the output of the second delay means; and
    a fourth gate having a first input coupled to the output of the third gate and the second input coupled to the output of the second gate, whereby the output of the fourth gate is a second frequency signal, and the second frequency being twice the first frequency and having a symmetrical duty cycle.

2. A frequency doubler according to claim 1 wherein the first delay period is substantially equal to one half the pulse width of the input signal and the sum of the second delay period and the propagation delays in the first and second gates is substantially equal to one half the pulse width of the input signal.

3. A frequency doubler according to claim 1 wherein the gates are NOR gates.

4. A frequency doubler according to claim 1 wherein the delay means comprise a resistor coupled between gates and a capacitor coupled between the resistor and the point of reference potential.

5. A frequency doubler according to claim 1 wherein the first delay period is substantially different from the second delay period and the output of the second gate has a pulse width substantially different from the output of the third gate, said outputs having the same frequency as the first frequency signal.

* * * * *